(12) United States Patent
Park

(10) Patent No.: US 7,129,542 B2
(45) Date of Patent: Oct. 31, 2006

(54) HIGH VOLTAGE SEMICONDUCTOR DEVICE HAVING HIGH BREAKDOWN VOLTAGE AND METHOD OF FABRICATING THE SAME

(75) Inventor: Chan-ho Park, Daejeon (KR)

(73) Assignee: Fairchild Korea Semiconductor Ltd., Puchon (KR)

( * ) Notice: Subject to any disclaimer, the term of this patent is extended or adjusted under 35 U.S.C. 154(b) by 1 day.

(21) Appl. No.: 10/714,607

(22) Filed: Nov. 18, 2003

(65) Prior Publication Data

US 2004/0094800 A1 May 20, 2004

Related U.S. Application Data

(63) Continuation of application No. 10/024,475, filed on Dec. 21, 2001, now abandoned.

(30) Foreign Application Priority Data

Jan. 15, 2001 (KR) ................... 2001-2166

(51) Int. Cl.
*H01L 31/62* (2006.01)
*H01L 31/119* (2006.01)
(52) U.S. Cl. .................. 257/342; 257/343; 257/347
(58) Field of Classification Search ............... 257/557, 257/563, 562, 342, 343, 347
See application file for complete search history.

(56) References Cited

U.S. PATENT DOCUMENTS

| | | | |
|---|---|---|---|
| 4,519,128 A * | 5/1985 | Chesebro et al. | ........... 438/433 |
| 4,725,562 A | 2/1988 | El-Kareh et al. | |
| 5,554,872 A * | 9/1996 | Baba et al. | ................. 257/342 |
| 5,770,465 A * | 6/1998 | MacDonald et al. | ........... 216/2 |
| 6,358,785 B1 | 3/2002 | Chittipeddi et al. | |

* cited by examiner

*Primary Examiner*—Zandra V. Smith
*Assistant Examiner*—Kiesha Rose
(74) *Attorney, Agent, or Firm*—Rothwell, Figg, Ernst & Manbeck

(57) ABSTRACT

A high voltage semiconductor device, including: a high concentration collector area of a first conductive type; a low concentration collector area of a first conductive type formed on the high concentration collector area; a base area of a second conductive type formed on the low concentration collector area and having a trench perforating the low concentration collector area in a vertical direction at the edge of the trench; a high concentration emitter area of a first conductive type formed on a predetermined upper surface of the base area; and an emitter electrode, a base electrode, and a collector electrode isolated from one another and connected to the emitter area, the base area, and the collector area, respectively. High breakdown voltage can be obtained with a narrow junction termination area due to the trench.

3 Claims, 7 Drawing Sheets

HIGH VOLTAGE SEMICONDUCTOR DEVICE HAVING HIGH BREAKDOWN VOLTAGE AND METHOD OF FABRICATING THE SAME

CROSS REFERENCE TO RELATED APPLICATION

This application is a continuation of U.S. application Ser. No. 10/024,475, filed Dec. 21, 2001, now abandoned.

BACKGROUND OF THE INVENTION

1. Field of the Invention

The present invention relates to a high voltage semiconductor device and a method of fabricating the same, and more particularly, to a high voltage semiconductor device having a high breakdown voltage and a method of fabricating the same.

2. Description of the Related Art

A strong electric field is generated at the inside or edge of a high voltage device, which reduces the breakdown voltage of the high voltage device. A representative method of preventing a strong electric field from being generated at the edge of the high voltage device is to use a floating field ring (also called a field limiting ring). The floating field ring, which is formed around a main junction without any electric contact, reduces the concentration of an electric field at a cylindrical junction by extending the boundary of a depletion area which is formed by an application of a reverse bias to the main junction. To increase the effect of the floating field ring, a plurality of floating field rings can be formed and will be described with reference to FIG. 1.

Figure 1:
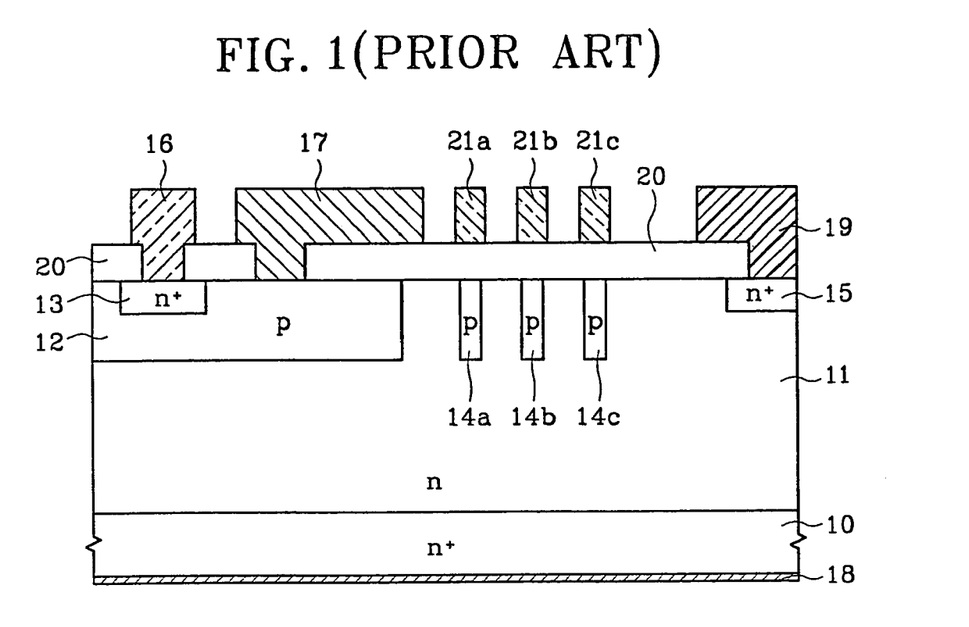
FIG. 1 is a cross-sectional view illustrating a junction termination of a high voltage semiconductor device using a plurality of conventional field limiting rings.

FIG. 1 is a cross-sectional view of a junction termination of a high voltage semiconductor device using a plurality of field limiting rings. Referring to FIG. 1, an $n^+$-type collector area 11 is formed on an $n^+$-type collector area 10. A p-type base area 12 is formed on an upper surface of the $n^-$-type collector area 11. An $n^+$-type emitter area 13 is formed on an upper surface of the p-type base area 12. Meanwhile, a plurality of floating field rings 14a, 14b, and 14c, which are spaced apart from the p-type base area 12, are formed on the surface of the $n^-$-type collector area 11. Only three floating field rings are shown in FIG. 1, however, more floating field rings may be formed. An $n^+$-type channel stopper 15 is formed on an upper surface of the $n^-$-type collector area 11 at regular intervals from the floating field ring 14c farthest from the p-type base area 12. An emitter electrode 16, a base electrode 17, a collector electrode 18 and an equipotential electrode 19 are formed to be electrically connected to the emitter area 13, the base area 12, the collector area 10, and the channel stopper 15, respectively. The electrodes 16, 17, 18, and 19 are insulated from one another by dielectric layers 20. Meanwhile, a plurality of plates 21a, 21b, and 21c are formed on the dielectric layer 20 above the floating field rings 14a, 14b, and 14c.

In a high voltage semiconductor device having the above-described structure, in a case where reverse bias is applied to a pn junction formed by the n-type collector area 11 and the p-type base area 12, a depletion area extends to each area around the floating field rings 14a, 14b, and 14c. As a result, the concentration of an electric field at a cylindrical junction is reduced and thus the breakdown voltage of the device increases.

This method of using a plurality of floating field rings is effective in improving the breakdown voltage of devices, however, demands a wider junction termination area.

Besides this method of using floating field rings, a method of using field plates, etch contour technology, bevel edge termination technology, junction termination extension technology, variation lateral doping technology, and a method of using a semi-insulating polysilicon layer are well known as ways of preventing generation of a strong electric field at a junction terminal. However, these methods all demand a wide junction termination area to obtain a high breakdown voltage.

SUMMARY OF THE INVENTION

To solve the above problems, it is a first object of the present invention to provide a high voltage semiconductor device having a high breakdown voltage and a narrow junction termination.

It is a second object of the present invention to provide a method of fabricating the high voltage semiconductor device.

Accordingly, to achieve the above first object, there is provided a high voltage semiconductor device. The high voltage semiconductor device includes: a high concentration collector area of a first conductive type; a low concentration collector area of a first conductive type formed on the high concentration collector area; a base area of a second conductive type formed on the low concentration collector area and having a trench which penetrates the low concentration collector area in a vertical direction at the edge of the trench; a high concentration emitter area of a first conductive type formed on a predetermined upper surface of the base area; and an emitter electrode, a base electrode, and a collector electrode isolated from one another and connected to the emitter area, the base area, and the collector area, respectively. The high voltage semiconductor device further includes a dielectric layer which fills the trench.

To achieve the second object, there is provided a method of fabricating a high voltage semiconductor device. A semiconductor substrate having a high concentration collector area and a low concentration collector area of a first conductive type is prepared. A base area of a second conductive type is formed on the low concentration collector area. A high concentration emitter area of a first conductive type is formed on a predetermined upper portion of the base area. A trench penetrating the base area and the low concentration collector area is formed at the edge of the base area, spaced apart from the emitter area. An emitter electrode, a base electrode, and a collector electrode are formed to be connected to the emitter area, the base area, and a semiconductor substrate, respectively. The trench is preferably formed using a reactive ion etching method. The reactive ion etching is performed using $Cl_2$ or $SF_6$ as a reaction gas.

The width of the trench is $1/10$ times the depth of the trench.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Hereinafter, preferred embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art. In the drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

Figure 2:
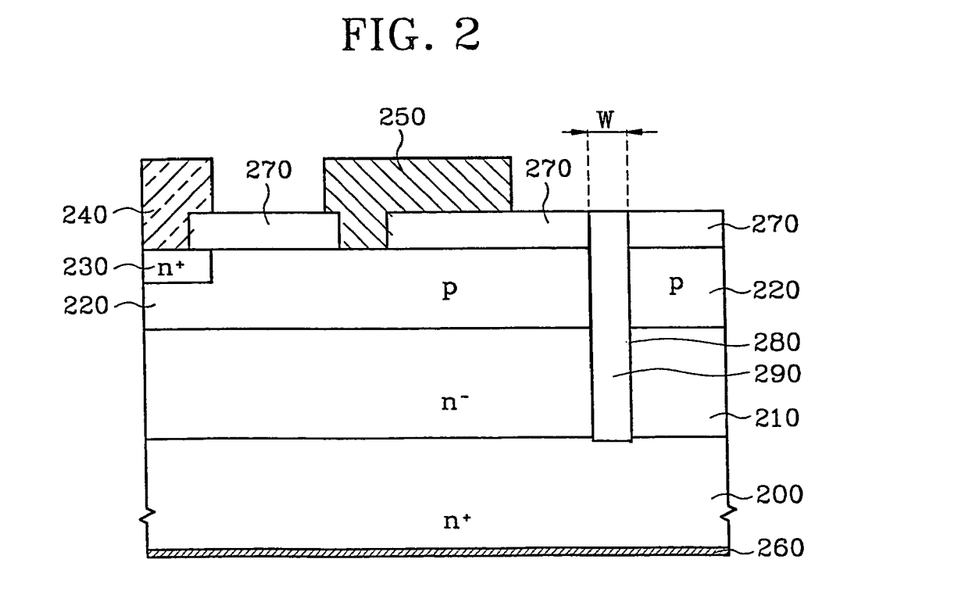
FIG. 2 is a cross-sectional view illustrating a junction termination of a high voltage semiconductor device according to the present invention.

FIG. 2 is a cross-sectional view of a junction termination of a high voltage semiconductor device according to the present invention. Referring to FIG. 2, a low concentration first conductive type, e.g., an n$^-$-type, collector area 210 is formed on a high concentration first conductive type, e.g., an n$^+$-type, collector area 200. A second conductive type, e.g., a p-type, base area 220 is formed on the n$^-$-type collector area 210. An n$^+$-type emitter area 230 is formed on an upper surface of the p-type base area 220. An emitter electrode 240, a base electrode 250, and a collector electrode 260 are formed to be connected to the n$^+$-type emitter area 230, the p-type base area 220, and the n$^+$-type collector area 200, respectively. The emitter electrode 240 and the base electrode 250 are insulated from each other through a dielectric layer 270.

A trench 280, which penetrates the p-type base area 220 and the n$^-$-type collector area 210, is formed at the edge of the p-type base area 220. The trench 280 may be filled with a dielectric layer 290 such as an oxide layer. The depth of the trench 280 may vary based on the desired breakdown voltage. For example, for the breakdown voltage to be in the range of about 500 V~2000 V, the depth of the trench 280 must be about 50~200 μm. In this case, it is preferable that the width W of the trench 280 is 1/10 times the depth of the trench 280, i.e., about 5~20 μm. The shape of a depletion area varies depending on the width W of the trench 280. A breakdown voltage property of a device varies depending on the shape of the depletion area. This will be described in detail with reference to drawings.

Figure 3A:
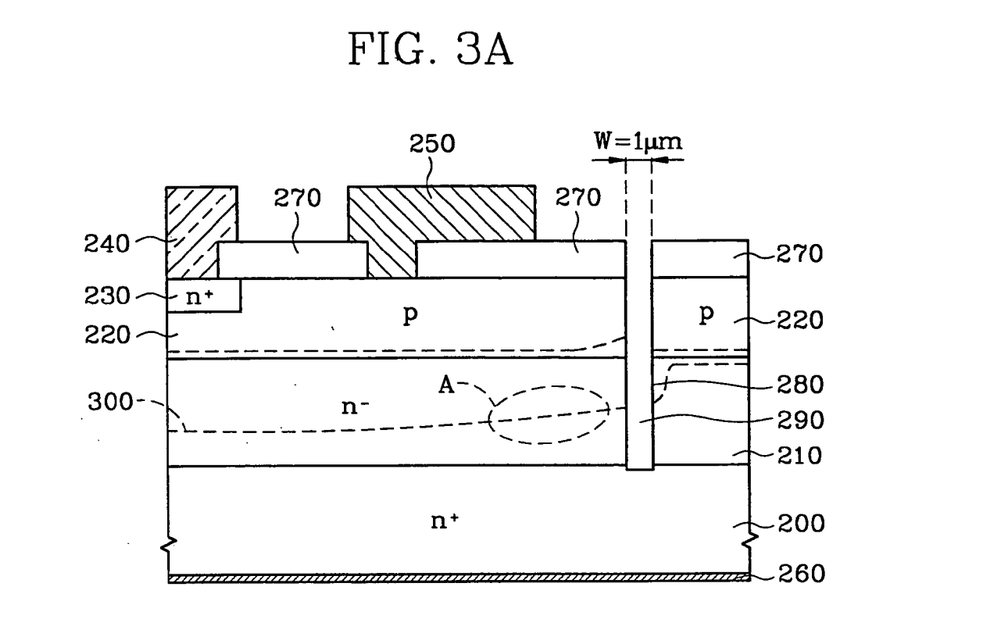
FIGS. 3A through 3C and 4A through 4C are cross-sectional views for describing the effect of the present invention.
Figure 3B:
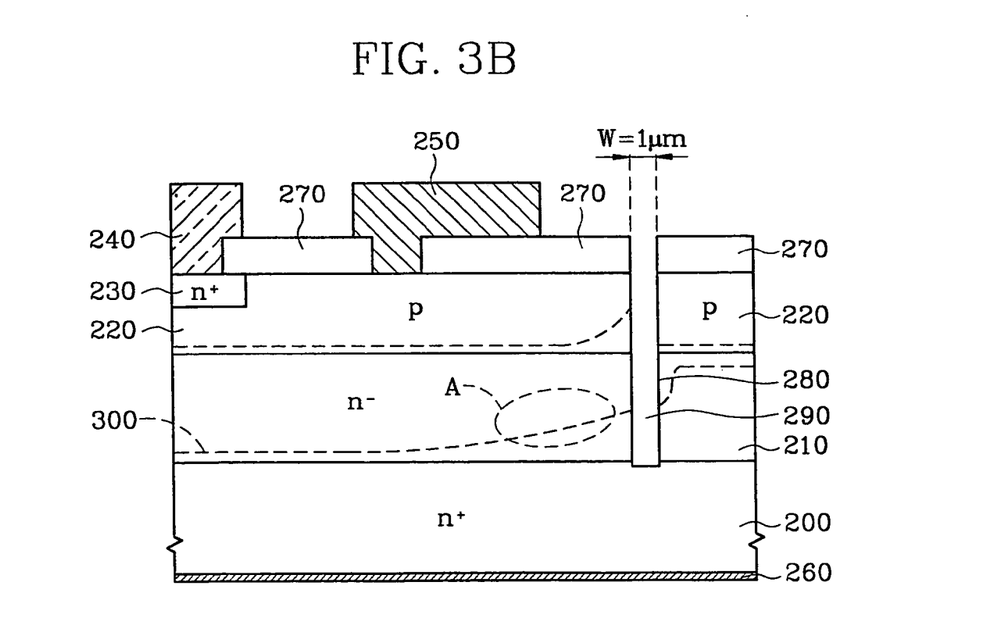
Figure 3C:
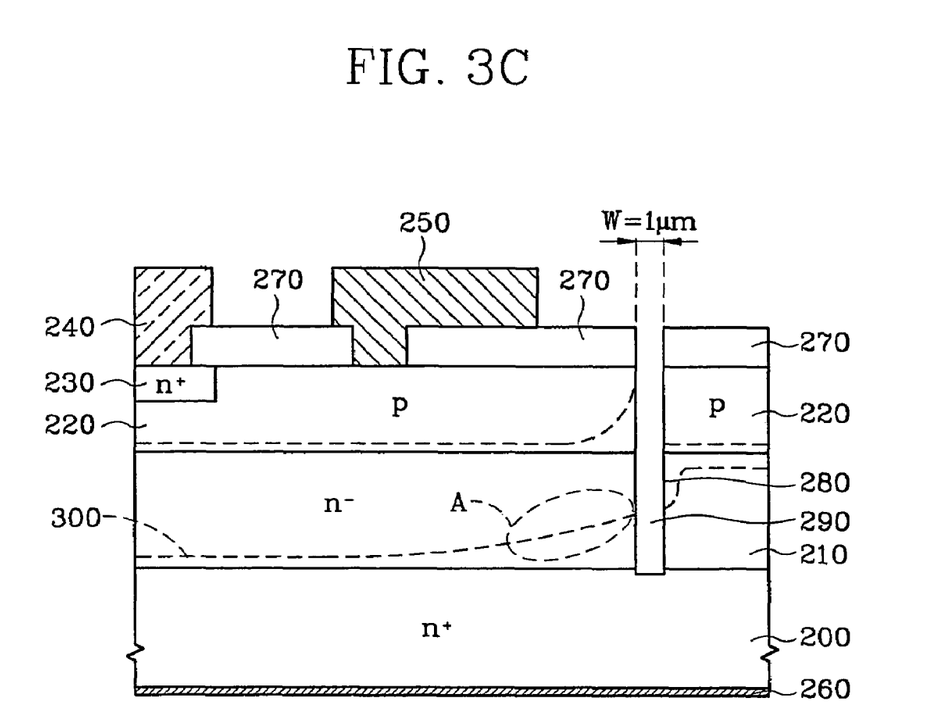

FIGS. 3A through 3C are cross-sectional views showing the depletion areas formed if the width of the trench 280 of the high voltage semiconductor device according to the present invention is 1 μm, for three different collector voltages.

In detail, in FIG. 3A, a depletion area 300, which extends toward the n$^-$-type collector area 210, is curved toward the trench 280 (See "A") if the width of the trench 280 is 1 μm and the collector voltage is 100 V. In other words, a planar junction effect creating the highest breakdown voltage does not show. This phenomenon gets more serious as collector voltage is increased. In FIG. 3B the collector voltage is 200 V and in FIG. 3C the collector voltage is 300 V. As can be seen, the depletion area 300 is more seriously curved at the A area close to the trench 280 as the collector voltage increases. Thus, a reduction in breakdown voltage at this area results in reduction of the entire breakdown voltage of the device.

Figure 4A:
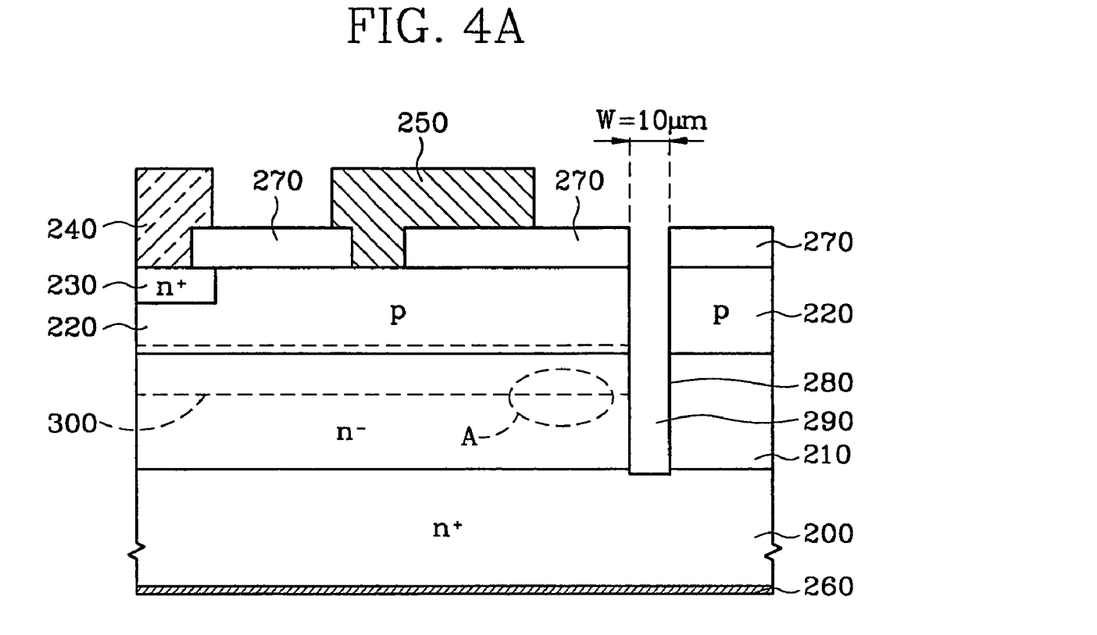
Figure 4B:
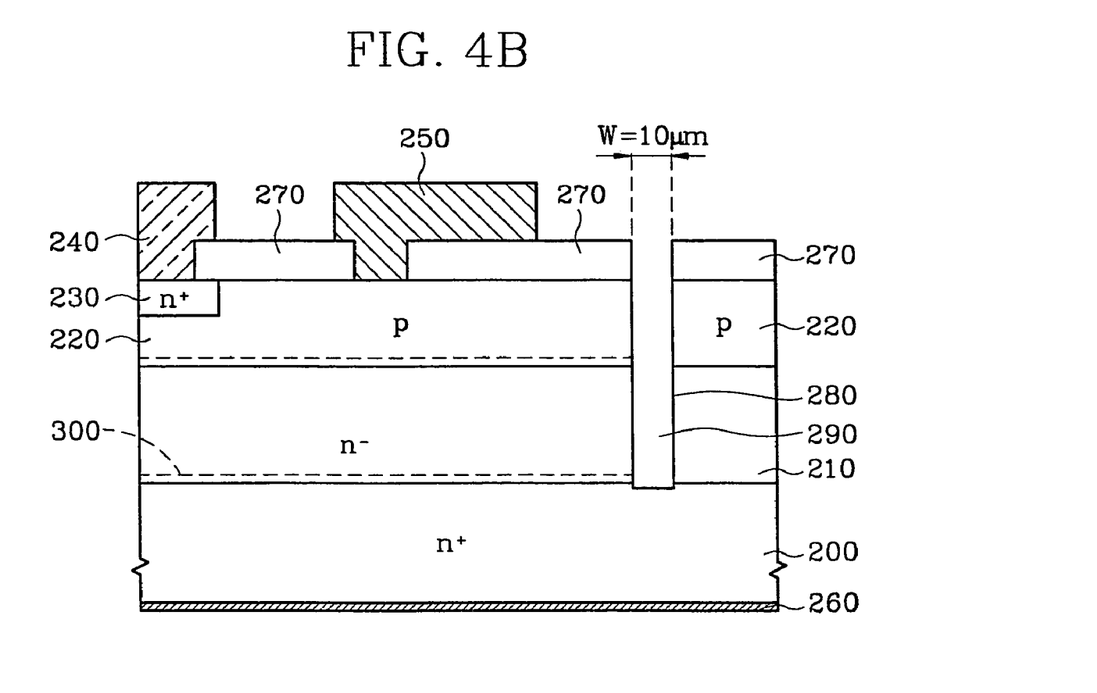
Figure 4C:
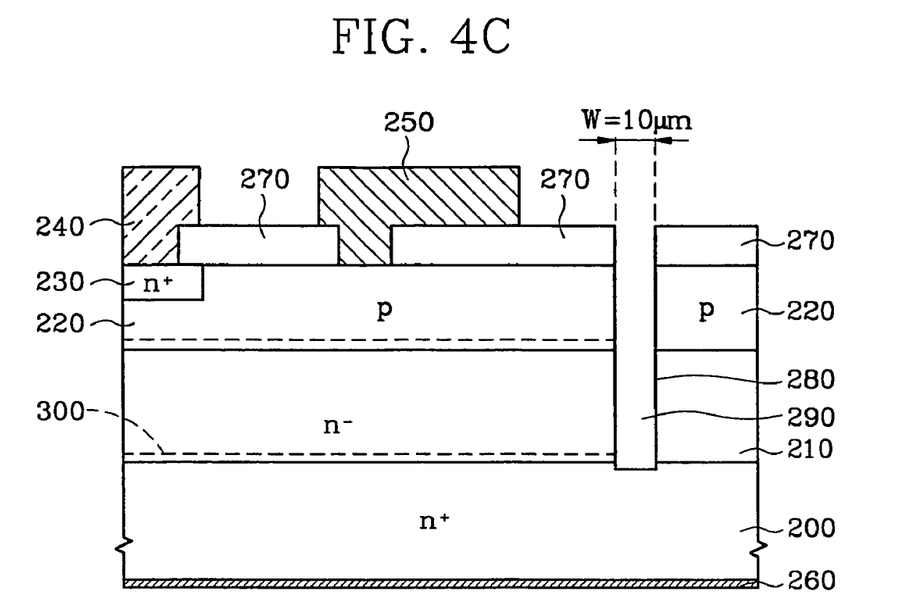

FIGS. 4A through 4C are cross-sectional views of depletion areas formed if the width of the trench 280 of the high voltage semiconductor device according to the present invention is 10 μm, for three different collector voltages.

As shown in FIG. 4A, if the collector voltage is 500 V, the depletion area 300, which extends toward the n$^-$-type collector area 210, is planar toward the trench 280 (See "A"). The planar junction effect creating the highest breakdown voltage shows. As a result, breakdown voltage is considerably increased at a junction termination of the device. In FIG. 4B, if the collector voltage is 1000 V, the depletion area 300 is still planar toward the trench 280. In FIG. 4C, if the collector voltage is 1500 V, the depletion area 300 is still planar toward the trench 280. Here, the depletion area 300 shows an ideal planar junction property.

Figure 5:
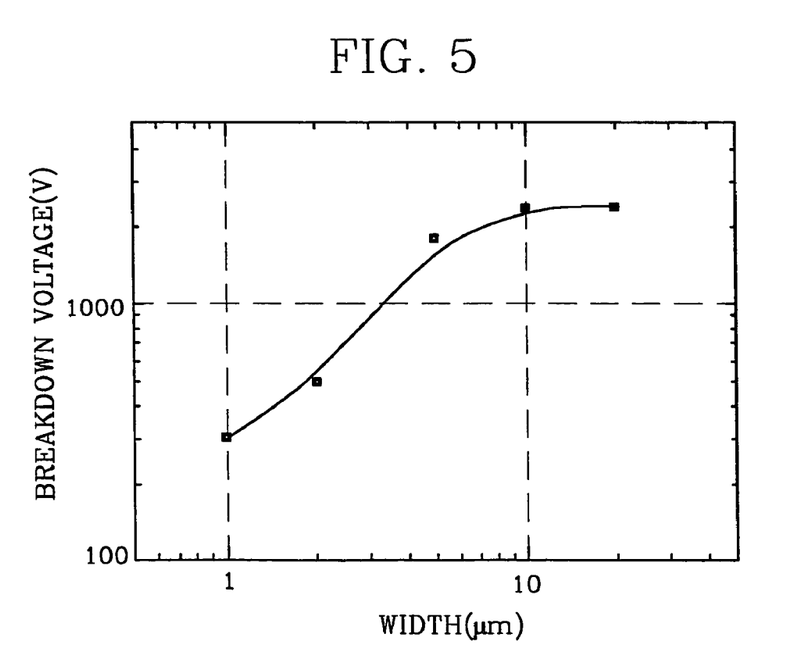
FIG. 5 is a graph showing a breakdown voltage of a high voltage semiconductor device according to the present invention based on the width of a trench.

FIG. 5 is a graph showing variation in the breakdown voltage of a high voltage semiconductor device based on variation in the width of the trench of the high voltage semiconductor device according to the present invention. As shown in FIG. 5, breakdown voltage levels off under a saturated condition when the width W of the trench 280 is over 10 μm. Meanwhile, when the width W of the trench 280 is less than 10 μm, the breakdown voltage decreases as the width W of the trench 280 gets narrower. It is seen that the breakdown voltage is at the lowest value if the width W of the trench 280 is 1 μm or less. In other words, as the width W of the trench 280 gets narrower, a predetermined voltage is applied to the right area of the trench 280 due to capacitive coupling caused by the oxide layer 290 inside the trench 280. As a result, a depletion area extends toward the surface of a substrate due to a charge neutrality condition in the depletion area, which causes the boundary of the depletion area to be curved. Finally, a strong electric field is generated across the depletion area, thereby resulting in a relatively low breakdown voltage.

Table 1 below shows aspect ratio and breakdown voltage based on the width of the trench of a high voltage semiconductor device according to the present invention.

TABLE 1

|  | Width of Trench | | | | |
| --- | --- | --- | --- | --- | --- |
|  | 1 μm | 2 μm | 5 μm | 10 μm | 20 μm |
| Aspect Ratio | 160:1 | 80:1 | 32:1 | 16:1 | 8:1 |
| Breakdown Voltage | 302 V | 495 V | 1760 V | 2310 V | 2310 V |

As shown in table 1, breakdown voltage is uniformly about 2310 V when the trench width is over 10 μm.

Table 2 below shows breakdown voltage and junction termination area based on various junction termination structures.

TABLE 2

| Junction Termination Structure | Breakdown voltage | Junction Termination Area |
| --- | --- | --- |
| Field Plate Structure | 60 |  |
| Structure of A plurality of Field Limiting Rings | 80 | 100 |

TABLE 2-continued

| Junction Termination Structure | Breakdown voltage | Junction Termination Area |
|---|---|---|
| Etch Contour Structure | 90 | 64 |
| Bevel Edge Termination Structure | 100 | |
| Junction Termination Extension Structure | 95 | 75 |
| Semi-dielectric Polysilicon Layer Structure | 80 | 36 |
| Trench Structure of Present Invention | 92 | 4 |

Table 2 shows relative breakdown voltages based on a bevel edge termination structure having a breakdown voltage of 100, and relative junction termination areas based on a structure of a plurality of field limiting rigs having a junction termination area of 100. As shown in table 2, a high voltage semiconductor device obtains 92% of the breakdown voltage of the bevel edge termination structure and requires only 4% of the junction termination area required by the structure of a plurality of field limiting rings.

Figure 6:
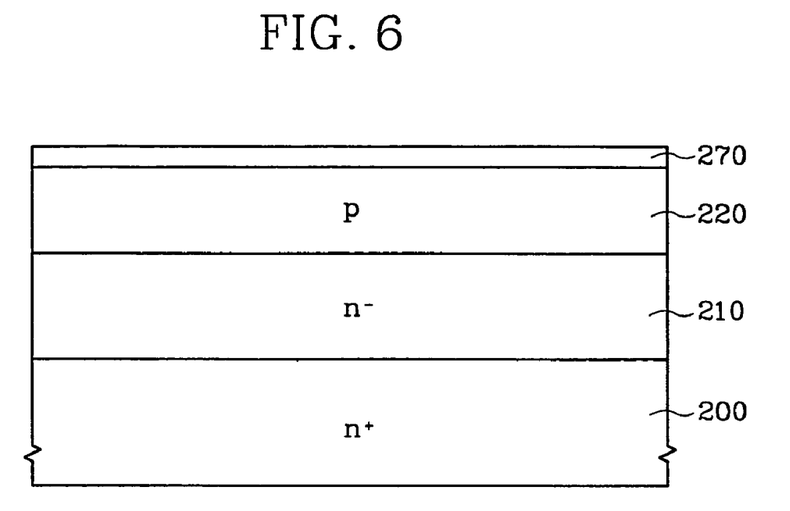
FIGS. 6 through 9 are cross-sectional views showing a method of fabricating a high voltage semiconductor device according to the present invention.

FIGS. 6 through 9 show cross-sectional views for describing a method of fabricating a high voltage semiconductor device according to the present invention. Referring to FIG. 6, a first high concentration conductive type, e.g., an n$^+$-type, semiconductor substrate 200 is used as a high concentration collector area. A first low density conductive type, e.g., an n$^-$-type, collector area 210 is formed on the n$^+$-type semiconductor substrate 200. It is preferable that the n$^-$-type collector area 210 is formed to a thickness appropriate for a desired breakdown voltage, within the range of about 50~200 μm, using an epitaxial growth method. A second conductive type opposite to a first conductive type, e.g., p-type, impurity ions are implanted into the n$^-$-type collector area 210. Next, a p-type base area 220 is formed on the n$^-$-type collector area 210 by performing a drive-in diffusion process. The drive-in diffusion process is performed for a long time at a high temperature of about 1200° C. or more and thus the implanted impurity ions are diffused. An oxide layer 270 is formed on the p-type base area 220 by performing a thermal oxidation process.

Figure 7:
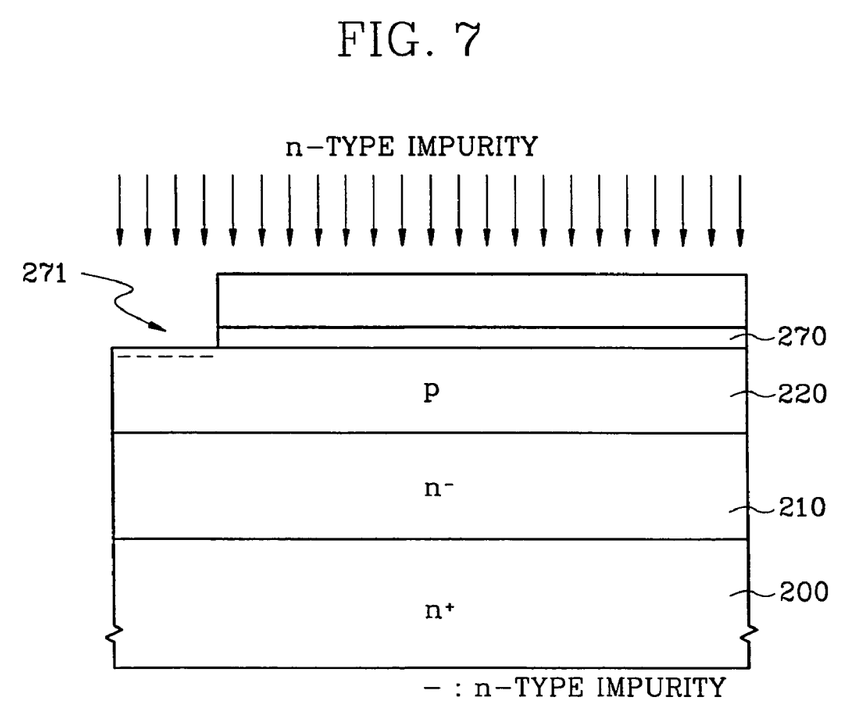

With reference to FIG. 7, a mask pattern, e.g., a photoresist layer pattern (not shown), is formed on the p-type base area 220 and the oxide layer 270. An opening 271 for opening a portion of the p-type base area 220 on which an n$^+$-type emitter area will be formed is made at a portion of the oxide layer 270 by an etching process. Then, n-type impurities are implanted into the portion of the p-type base area 220 on which the n$^+$-type emitter area will be formed using the oxide layer 270 as an impurity implantation mask.

Figure 8:
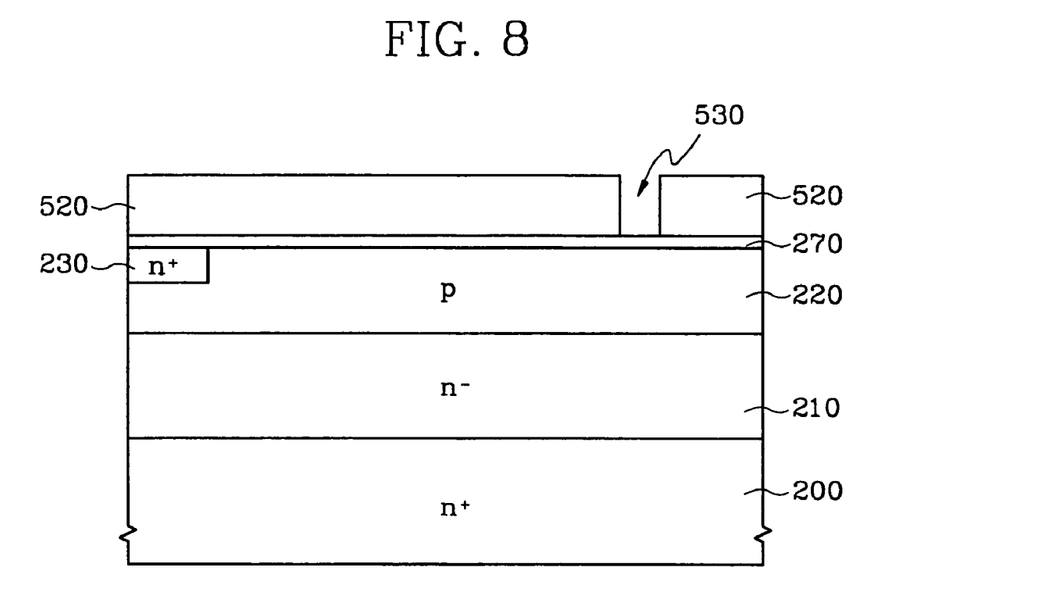

Referring to FIG. 8, an n$^+$-type emitter area 230 is formed on the portion of the p-type base area 220 by drive-in diffusing the n-type impurities implanted into the p-type base area 220. The oxide layer 270 is re-grown by a thermal oxidation process. A photoresist layer pattern 520 is formed on the oxide layer 270 which covers the surfaces of the p-type base area 220 and the n$^+$-type emitter area 230. The photoresist layer pattern 520 has an opening 530 for exposing a portion of the oxide layer 270.

Figure 9:
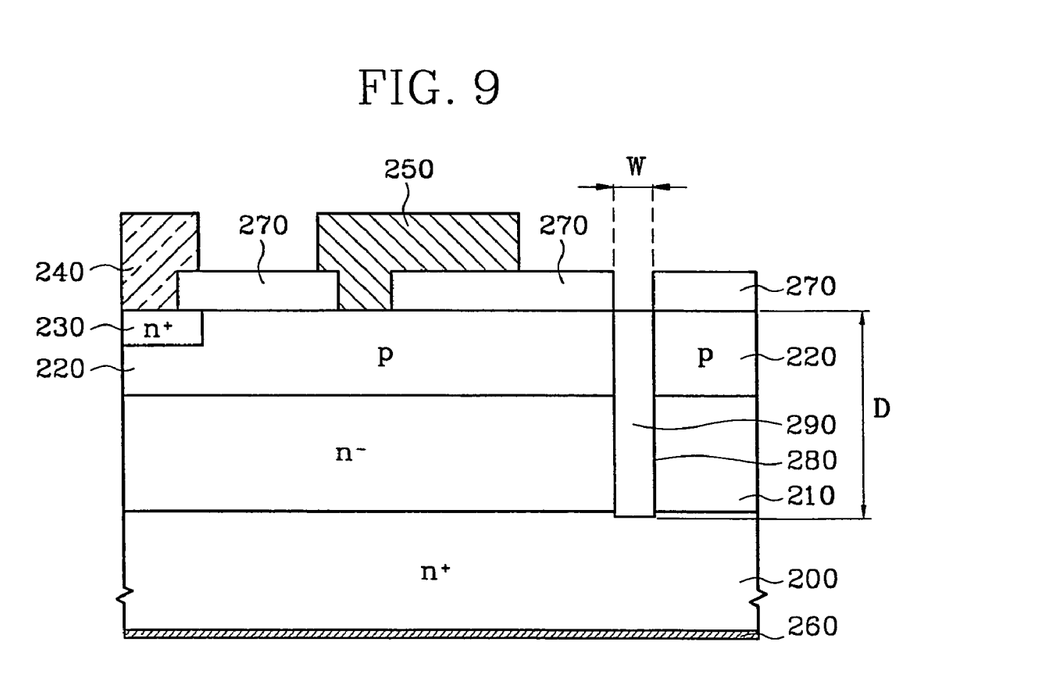

With reference to FIG. 9, the oxide layer 270 is etched using the photoresist layer pattern 520 as an etching mask and then the photoresist layer pattern 520 is removed. A reactive ion etching process is performed using the oxide layer 270 as an etching mask, thereby forming a trench 280 of uniform width which penetrates the p-type base area 220 and the n-type collector area 210. In more detail, the structure body of FIG. 8 is loaded into a reactive ion etching chamber and anisotropic etching is performed by forming chlorine-based plasma or fluorine-based plasma. It is preferable that $Cl_2$ is used as a reaction gas for forming the chlorine-based plasma and $SF_6$ is used as a reaction gas for forming fluorine-based plasma. The depth D of the trench 280 varies based on a desired breakdown voltage. For example, the depth D of the trench 280 should be about 50~200 μm and the width W of the trench 280 should be 1/10 times the depth D, i.e., about 5~20 μm to obtain a breakdown voltage of about 500~2000 V.

When the reactive ion etching process is completed, the surface and inside of the trench 280 is filled with a dielectric layer 290 such as an oxide layer by a chemical vapor deposition method. An opening is formed to expose an emitter contact portion and a base contact portion using a mask layer. An emitter electrode 240 connected to the n$^+$-type emitter area 230 and a base electrode 250 connected to the p-type base area 220 are formed. Next, a collector electrode 260 is formed to be connected to the n$^+$-type semiconductor substrate 200.

As described above, in fabricating a high voltage semiconductor device according to the present invention, a trench is formed through a p-type base area and an n$^-$-type collector area to a predetermine depth using a reactive ion etching process. As a result, a depletion area at a junction termination can approach an ideal planar junction structure and thus breakdown voltage can be improved. Also, a channel stopper and an equipotential electrode are unnecessary and forming a relatively narrow trench requires a considerably narrow junction termination area compared with other junction termination structures. In terms of the fabrication method, a mask layer is additionally used when forming the trench, not when forming the base area. Thus, it is possible to fabricate a high voltage semiconductor device according to the present invention by using the same number of masks as are necessary for fabricating a common high voltage semiconductor device.

What is claimed is:

1. A high voltage semiconductor device, comprising:
    a high concentration collector area of a first conductive type;
    a low concentration collector area of a first conductive type formed on the high concentration collector area;
    a base area of a second conductive type formed on the low concentration collector area and having a trench which penetrates the low concentration collector area in a vertical direction at a junction termination;
    a high concentration emitter area of a first conductive type formed on a predetermined upper surface of the base area; and
    an emitter electrode, a base electrode, and a collector electrode isolated from one another and connected to the emitter area, the base area, and the collector area, respectively,
    wherein the depth of the trench is 50–150 μm.

2. The high voltage semiconductor device of claim 1, further comprising an oxide layer which fills the trench.

3. The high voltage semiconductor device of claim 1, wherein the width of the trench is about 1/10 the depth of the trench.

* * * * *